(12) United States Patent
Chainer et al.

(10) Patent No.: US 10,098,258 B2
(45) Date of Patent: Oct. 9, 2018

(54) MINIMIZING LEAKAGE IN LIQUID COOLED ELECTRONIC EQUIPMENT

(71) Applicant: International Business Machines Corporation, Armonk, NY (US)

(72) Inventors: Timothy J. Chainer, Putnam Valley, NY (US); Pritish R. Parida, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/656,599

(22) Filed: Mar. 12, 2015

(65) Prior Publication Data

US 2016/0270259 A1    Sep. 15, 2016

(51) Int. Cl.
  *H05K 7/20*     (2006.01)
  *G01M 3/18*     (2006.01)
  *G01M 3/32*     (2006.01)

(52) U.S. Cl.
  CPC ........ *H05K 7/20272* (2013.01); *G01M 3/188* (2013.01); *G01M 3/3227* (2013.01); *H05K 7/20781* (2013.01)

(58) Field of Classification Search
  CPC .......... H05K 7/20218; H05K 7/20272; H05K 7/20627–7/20645; H05K 7/20763–7/20781; G06F 1/20; G06F 1/203; G01M 3/26
  USPC ................................... 361/679.53, 699, 702
  See application file for complete search history.

(56) References Cited

U.S. PATENT DOCUMENTS

| 4,981,021 A * | 1/1991 | Assaf ..................... F01K 11/02 165/54 |
| 5,086,829 A | 2/1992 | Asakawa ....................... 165/270 |
| 5,226,471 A * | 7/1993 | Stefani ............... H05K 7/20281 165/103 |
| 5,333,676 A | 8/1994 | Mizuno ......................... 165/294 |
| 6,609,213 B1 | 8/2003 | Nguyen et al. .............. 714/4.12 |
| 6,775,137 B2 * | 8/2004 | Chu .................. H05K 7/20754 165/120 |
| 7,270,174 B2 | 9/2007 | Chu et al. ..................... 165/11.1 |
| 7,848,106 B2 * | 12/2010 | Merrow ............ G05D 23/1934 165/104.33 |
| 7,905,096 B1 * | 3/2011 | Campbell ........... H05K 7/20836 62/259.2 |

(Continued)

FOREIGN PATENT DOCUMENTS

JP    2006066669    3/2006    ......... H01L 23/473

OTHER PUBLICATIONS

Environmental Monitoring Brochure, Black Box Network Services, pp. 1-20 (publication date unknown).

*Primary Examiner* — Dion R Ferguson
*Assistant Examiner* — Amir Jalali
(74) *Attorney, Agent, or Firm* — Ido Tuchman; Daniel P. Morris

(57) ABSTRACT

An apparatus for minimizing the volume of coolant leaked in liquid cooled electronic equipment, the apparatus including a server rack, a plurality of closed liquid cooling loops, a plurality of liquid to liquid heat exchangers, and a plurality of pumps. The closed liquid cooling loops are coupled to at least one of the servers in the server rack. Each of the closed liquid cooling loops restricts coolant flow entirely within the server rack. The closed liquid cooling loops may provide the entire volume of coolant provided to each server in the server rack.

10 Claims, 9 Drawing Sheets

(56) References Cited

U.S. PATENT DOCUMENTS

| | | | |
|---|---|---|---|
| 8,144,467 B2* | 3/2012 | Campbell | F24F 3/14 165/104.33 |
| 8,531,839 B2 | 9/2013 | Iyengar et al. | 361/699 |
| 8,555,951 B2 | 10/2013 | Delia et al. | 165/11.1 |
| 8,583,290 B2 | 11/2013 | Campbell et al. | 700/282 |
| 8,953,320 B2* | 2/2015 | Campbell | H05K 7/20809 165/104.21 |
| 2004/0057211 A1 | 3/2004 | Kondo | H05K 7/20 |
| 2004/0219405 A1* | 11/2004 | Lyon | H01M 8/04186 429/430 |
| 2004/0265662 A1* | 12/2004 | Brignone | H01M 8/04029 429/440 |
| 2005/0126747 A1 | 6/2005 | Chu | H05K 7/20 |
| 2006/0187638 A1 | 8/2006 | Vinson | H05K 7/20 |
| 2007/0201204 A1 | 8/2007 | Upadhya | H05K 7/20 |
| 2007/0260417 A1 | 11/2007 | Starmer | G01K 7/425 |
| 2008/0276639 A1* | 11/2008 | Stoddard | G06F 1/20 62/259.2 |
| 2009/0261228 A1* | 10/2009 | Merrow | G05D 23/1928 248/550 |
| 2011/0313576 A1* | 12/2011 | Nicewonger | F28D 15/00 700/282 |
| 2012/0026004 A1 | 2/2012 | Broniak et al. | 340/870.02 |
| 2013/0091883 A1* | 4/2013 | Perez | F25B 30/02 62/203 |
| 2013/0094139 A1 | 4/2013 | Campbell et al. | 361/679.47 |
| 2013/0205822 A1* | 8/2013 | Heiland | H05K 7/2079 62/259.2 |
| 2013/0333865 A1 | 12/2013 | Goth et al. | 165/104.31 |
| 2014/0202678 A1* | 7/2014 | Goth | H05K 7/20772 165/287 |
| 2014/0251583 A1 | 9/2014 | Eriksen | H05K 7/20 |
| 2015/0048950 A1* | 2/2015 | Zeighami | H05K 7/20781 340/605 |

* cited by examiner

MINIMIZING LEAKAGE IN LIQUID COOLED ELECTRONIC EQUIPMENT

BACKGROUND

This invention generally relates to the liquid cooling of electronic equipment, and more particularly to minimizing the volume of coolant lost in the event of a leak in liquid cooled electronic equipment.

Data centers are facilities that house numerous computer systems arranged in the form of electronics racks. Typically, a data center may house on the order of a few thousands of electronic racks. Each computer system in a rack may include one or more processors, memory devices, controllers, power converters and manipulators and other such electronic components which perform different operations and dissipate varying amounts of heat. Moreover, depending upon the state of operation, a computer system may dissipate on the order of few hundreds of Watts to thousands of Watts. Therefore, a significant amount of cooling is required to keep the electronic components within an optimum operating temperature range (typically, 75° C. to 85° C.).

According to the 2007 Report to Congress on Server and Data Center Energy Efficiency, in 2005, server driven power usage amounted to 1.2% of total US energy consumption. Over the past several years, energy use by these centers and their supporting infrastructure is estimated to have increased by nearly 100 percent (United States Department of Energy Information and Communications Technology Roadmap). In the face of growing global energy demand, uncertain energy supplies, and volatile energy prices, innovative solutions are needed to radically advance the energy efficiency of these data center systems.

Recent studies have shown that cooling energy comprises about 25% to 40% of the total data center energy consumption. Liquid cooling of computer systems is one method of increasing the cooling energy efficiency. However, concerns, such as liquid leaks, limit the market penetration and implementation of liquid cooling solutions for data center cooling.

In conventional liquid cooled systems, the liquid coolant is provided by a liquid coolant distribution unit. In the case of a liquid coolant leak, there is a high probability that the entire volume of the liquid coolant in the concerned leaking liquid loop could be spilt. Thus, the entire computer system connected to the leaking liquid loop needs to be shut off, immaterial of where the leak originated, resulting in shutting-off unaffected computational resources/systems.

BRIEF SUMMARY

Accordingly, one embodiment of the present invention is an apparatus for minimizing the volume of coolant leaked in liquid cooled electronic equipment. The apparatus may include a server rack housing a plurality of servers. The server rack includes a plurality of closed liquid cooling loops in the server rack. Each of the closed liquid cooling loops in the server rack may be coupled to at least one of the servers in the server rack. The closed liquid cooling loops restrict coolant flow entirely within the server rack. The server rack may further include a plurality of liquid to liquid heat exchangers in the server rack. Each of the liquid to liquid heat exchangers may be coupled to one of the closed liquid cooling loops in the server rack. Further, the server rack may include a plurality of pumps. Each of the pumps circulates a coolant inside one of the closed liquid cooling loops. The pumps may be coupled to one of the closed liquid cooling loops in the server rack.

Another embodiment of the present invention is an apparatus for minimizing the volume of coolant leaked in liquid cooled electronic equipment should a leak occur. The apparatus includes a server rack housing a plurality of servers, a closed liquid cooling loop coupled to each of the servers in the server rack, a leak detection sensor configured to detect a condition indicative of a coolant leak from one of the closed liquid cooling loops, a liquid to liquid heat exchanger coupled to each of the closed liquid cooling loops in the server rack, and a pump coupled to each of the closed liquid cooling loops. Each of the closed liquid cooling loops restricts coolant flow entirely within the server rack. The pump circulates a volume of coolant inside the closed liquid cooling loop.

Another aspect of the present invention is a method of minimizing the volume of coolant leaked in a liquid cooled electronic system. The method includes detecting a coolant leak in a closed liquid cooling loop from a plurality of closed liquid cooling loops in the server rack. The closed liquid cooling loop may be coupled to at least one server in the server rack. The method may further include identifying the location of the coolant leak in the closed liquid cooling loop of an affected server in the server rack, and powering off a pump, from a plurality of pumps in the server rack, pumping coolant in the closed liquid cooling loop having the coolant leak.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
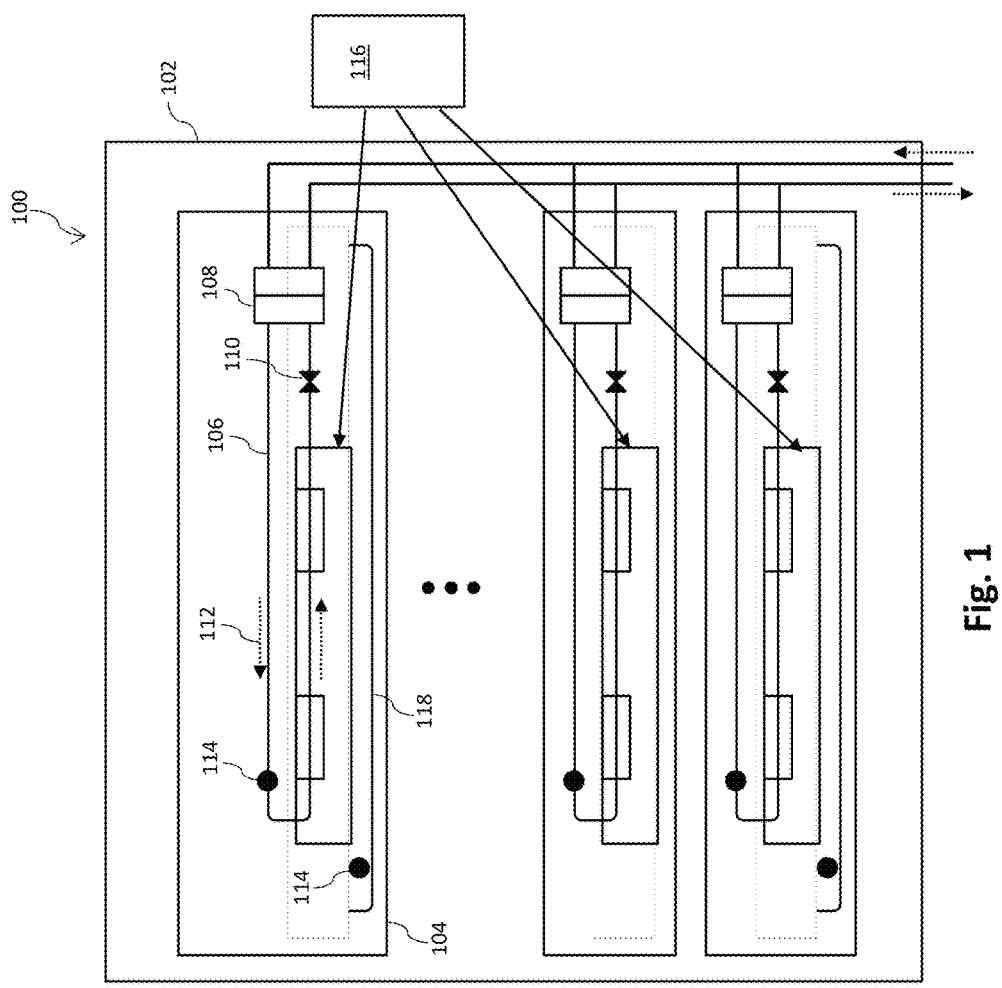
FIG. 1 shows an apparatus for minimizing coolant leak volume according to one embodiment of the invention.

The present invention is described with reference to embodiments of the invention. Throughout the description of the invention reference is made to FIGS. 1-8. When referring to the figures, like structures and elements shown throughout are indicated with like reference numerals.

FIG. 1 shows an apparatus 100 for minimizing coolant leak volume according to one embodiment of the present invention. The apparatus 100 may include a server rack 102, a plurality of closed liquid loops 106, a plurality of liquid to liquid heat exchangers 108, and a plurality of pumps 110. The plurality of liquid to liquid heat exchangers 108 in the server rack 102 may be coupled to at least one of the closed liquid cooling loops 106 in the server rack 102. It is contemplated that the server rack 102 may house a plurality of servers 104 as illustrated (reference numerals omitted on additional servers to avoid visual clutter).

The plurality of closed liquid cooling loops 106 in the server rack 102 may be coupled to at least one of the servers 104 in the server rack 102. Each of the closed liquid cooling loops 106 restricts coolant flow entirely within the server rack 102. Each closed liquid cooling loop 106 may provide the entire volume of coolant provided to its respective server 104 in the server rack 102.

The plurality of pumps 110 may be coupled to the closed liquid cooling loops 106 in the server rack 102. Each of the pumps 110 circulates a coolant 112 inside one of the closed liquid cooling loops 106.

According to one embodiment of the present invention, each of the closed liquid cooling loops 106 may contain an entire volume of coolant provided to at least one of the servers 104 in the server rack 102.

According to another embodiment of the present invention, the apparatus 100 for minimizing coolant leak volume may include a plurality of leak detection sensors 114 in the server rack 102. Each of the leak detection sensors 114 may be coupled to at least one of the servers 104 in the server rack 102. The leak detection sensors 114 may be positioned in various locations within the server rack 102. For example, a leak detection sensor 114 may be placed within the closed liquid cooling loop 106 to detect a drop in coolant pressure or flow rate. In another embodiment, a leak detection sensor 114 may be placed in a catch basin 118 and is configured to detect changes in electrical conductivity.

According to yet another embodiment of the present invention, the apparatus 100 for minimizing coolant leak volume may further include a controller 116 to power off a server. The controller 116 may power off the server when the leak detection sensor 114 coupled to the server 104 detects a coolant leak.

According to another embodiment of the present invention, the closed liquid cooling loop 106 may isolate the coolant provided to each server 104 in the server rack 102. The volume of the coolant provided to each of the servers 104 is the volume of the coolant contained in each of the closed liquid cooling loops 106 coupled to the servers 104.

According to yet another embodiment of the present invention, the apparatus 100 for minimizing leakage in liquid cooled electronic equipment may further include a plurality of catch basins 118 in the server rack 102. Each of the catch basins 118 may be positioned below at least one of the servers 104 in the server rack 102. The catch basins 118 contain the leaked coolant from at least one of the closed liquid cooling loops 106. It is contemplated that the catch basins 118 may be positioned below every server 104 in the server rack 102. Each of the catch basins may include a leak detection sensor 114. Each catch basin 118 may be sized to contain all the coolant 112 within the closed liquid loop 106 of its respective server in the event of a leak. Thus, if there is a coolant leak in one of the servers, the coolant will not spill onto other servers.

Figure 2:
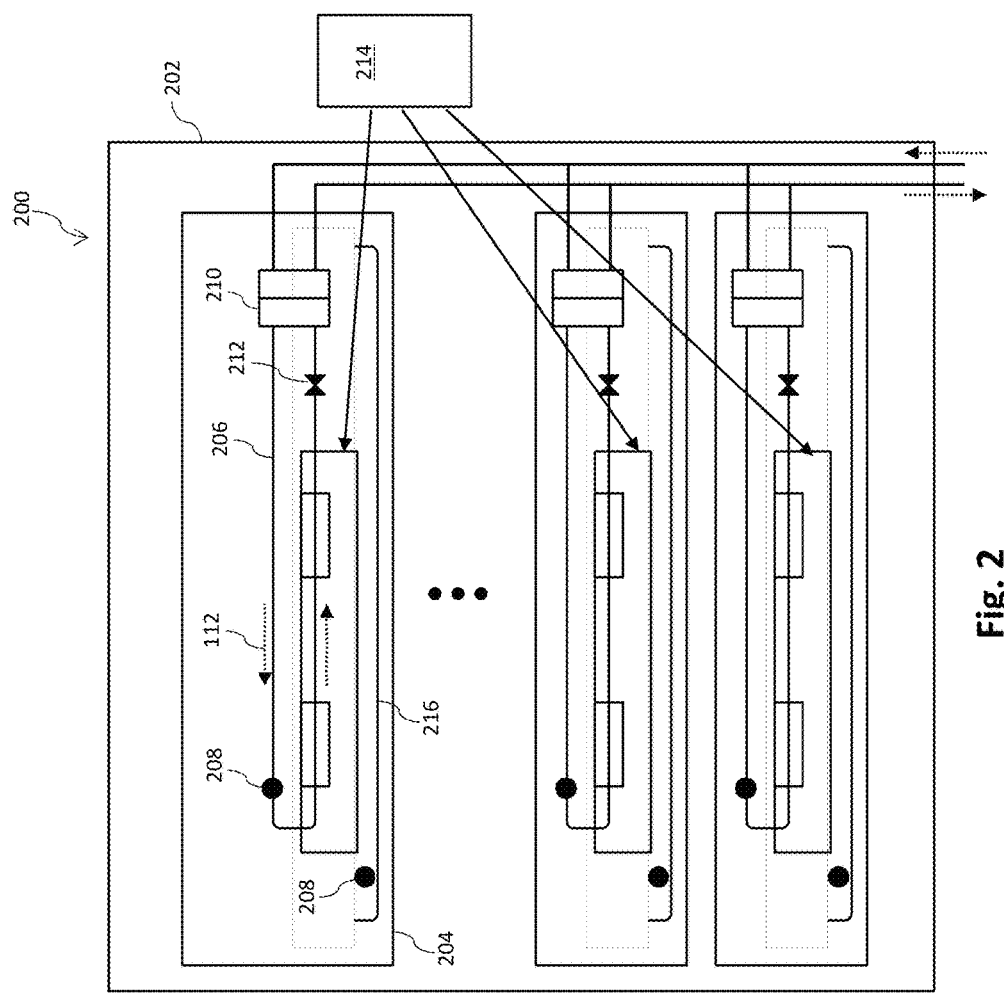
FIG. 2 shows an apparatus for minimizing coolant leak volume according to one embodiment of the invention.

FIG. 2 shows an apparatus for minimizing coolant leak volume according to another embodiment of the present invention. The apparatus 200 for minimizing the volume of coolant leaked in liquid cooled electronic equipment may include a server rack 202, a closed liquid cooling loop 206, a leak detection sensor 208, a liquid to liquid heat exchanger 210, and a pump 212. The server rack 202 may house a plurality of servers 204 as illustrated (without redundant reference numerals as with FIG. 1). The leak detection sensor 208 may be coupled to each of the closed liquid cooling loops 206 in the server rack 202. The liquid to liquid heat exchanger 210 may be coupled to each of the closed liquid cooling loops 206. The pumps 212 may be coupled to each of the closed liquid cooling loops 212. The pump 212 circulates a coolant inside the closed liquid cooling loop 206.

A separate closed liquid cooling loop 206 may be coupled to each of the servers 204 in the server rack 202. In this configuration, a closed liquid cooling loop 206 is provided for each server in the server rack.

According to one embodiment of the present invention, the closed liquid cooling loop 206 may contain the entire volume of coolant provided to its respective server 204 in the server rack 202.

According to another embodiment of the present invention, the apparatus 200 for minimizing leakage in liquid cooled electronic equipment may further include a controller 214 to power off a server 204. When the leak detection sensor 208 coupled to the server 204 detects a coolant leak, the controller 214 may power off the server 204.

According to yet another embodiment of the present invention, the closed liquid cooling loop 206 may isolate the coolant provided to each server 204 in the server rack 202. The volume of the coolant provided to each of the servers may be the entire volume of the coolant contained in its respective closed liquid cooling loop. Unlike conventional open loop cooling systems, a coolant leak at a server would cause only a finite amount of coolant to spill before all the coolant runs out of the closed loop.

According to another embodiment of the present invention, the apparatus 100 may further comprise a plurality of catch basins 216 in the server rack 202, each of the catch basins 216 may be positioned below at least one of the servers 204 in the server rack 202. The catch basins collect the leaked coolant from at least one of the closed liquid cooling loops 206.

According to yet another embodiment of the present invention, each of the catch basins 216 may include a leak detection sensor.

Figure 3A:
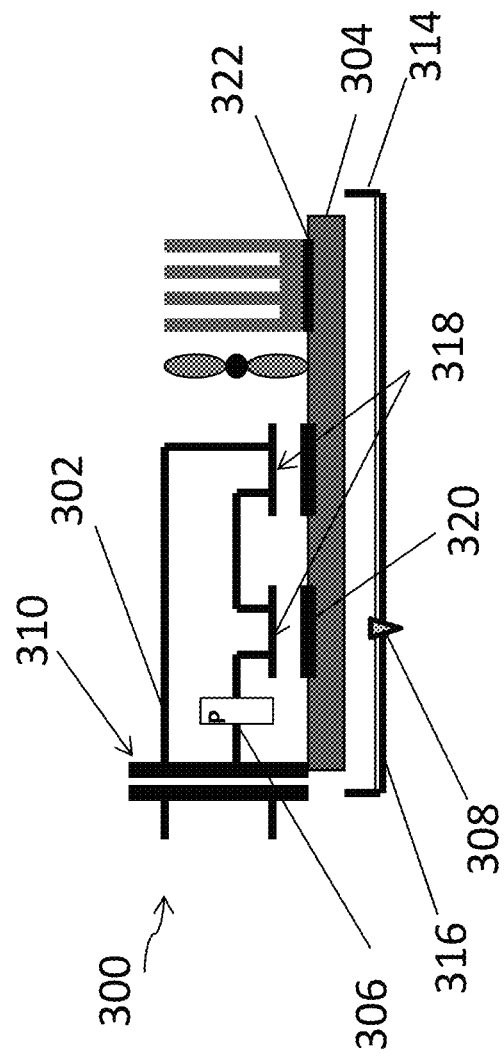
FIG. 3a shows closed liquid cooling loops for each server according to one embodiment of the invention.
Figure 3B:
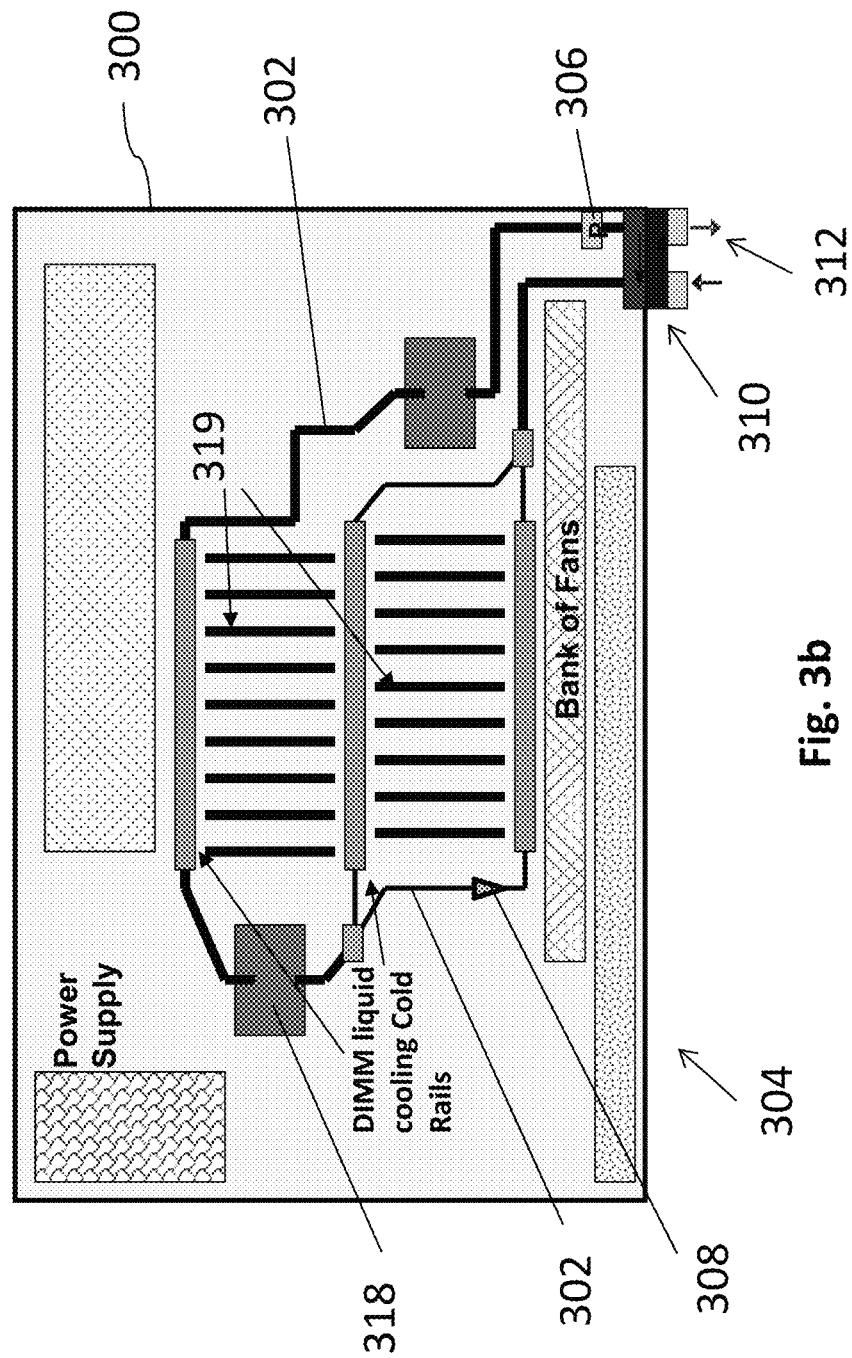
FIG. 3b shows a schematic of a closed liquid cooling loop for each server according to one embodiment of the invention.

FIGS. 3a and 3b show the server 300 at the server level in accordance with one embodiment of the present invention. The closed liquid cooling loop 302 may be designed for each individual server 304 in the server rack. Each of the servers 304 may include its own dedicated pump 306, one or more leak sensors 308 and liquid to liquid server heat exchanger 310. The closed liquid cooling loop 302 structure at the server level may include cold plates 318 for heat removal from electronic components such as CPUs 320, 322 and DIMMs 319.

The closed liquid cooling loop 302 structure may include a liquid to liquid server heat exchanger 310 and a pump 306 for circulating the coolant inside the server level closed liquid cooling loop 302 structure. The liquid to liquid heat exchanger 310 transfers the heat from the server 304 components to the facility side 312 of the closed liquid cooling loop 302. Each server 304 can be enclosed in a chassis 314 having an integrated catch basin 316 and one or more leak sensors 308 for leak detection.

In case there is a leak at the server level, the leak could be quickly detected and its affected servers can be checked immediately. This structure also provides fluid isolation between the closed liquid cooling loops inside the server rack such that the volume of liquid to the server is only the volume contained in the server liquid loop. The catch basin 316 is configured to contain leaked coolant and prevent spillage on servers positioned lower on the rack. Further, this liquid cooling approach enables individual servers in the presence of a leak to be turned off, while the remaining servers can be fully functional.

Figure 4:
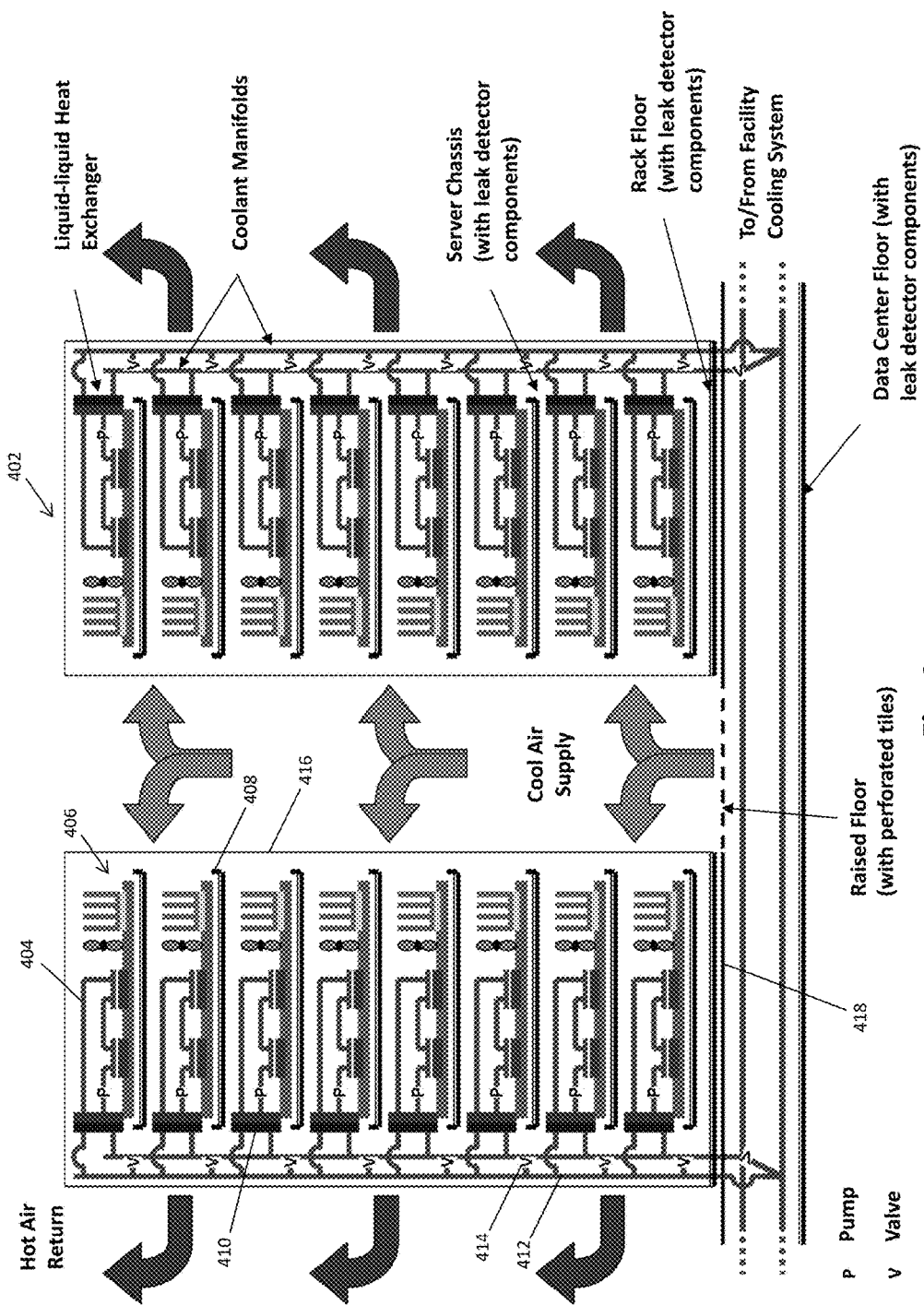
FIG. 4 shows a data center with a hybrid air/liquid cooled system in accordance with one embodiment of the invention.

FIG. 4 shows a data center 402 with closed liquid cooling loops 404 at each server 406 according to one embodiment of the present invention. According to one embodiment, a data center 402 may implement the closed liquid cooling loop system with hybrid air/liquid cooled servers. The data center closed liquid cooling loop system may include at least one server 406, a closed liquid cooling loop 404 at each server 406, a server chassis 408, and liquid to liquid heat exchangers 410.

Each server 406 has its own closed liquid cooling loop 404 and the coolant supply/return manifolds 412 have bypass valves 414 to allow or stop the coolant flow to any server 406 as needed. The data center may further include a server chassis 408 within each rack unit. Each server chassis 408, rack unit 416 and data center floor 418 could have leak detectors to increase the response time to a leak.

Figure 5:
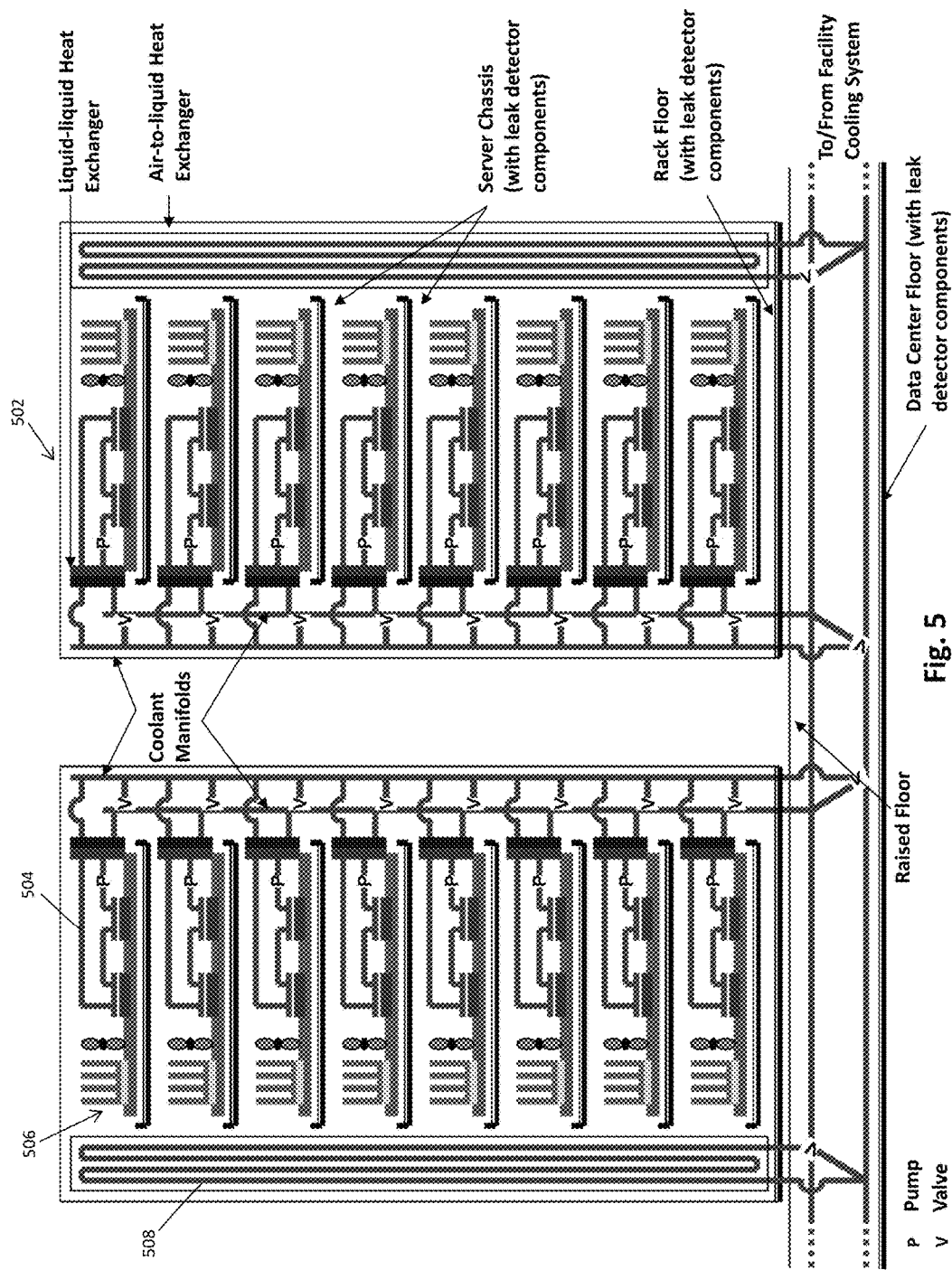
FIG. 5 shows a data center with a hybrid air/liquid cooled system in accordance with one embodiment of the invention.

FIG. 5 illustrates another possible data center 502 implementation for hybrid air/liquid cooled servers 506 where each server 506 has its own closed liquid cooling loop 504 and the air required for cooling of the air cooled components is re-circulated inside the rack. The heat from the heated air inside the rack is transferred to the liquid coolant through air to liquid heat exchanger 508.

Figure 6:
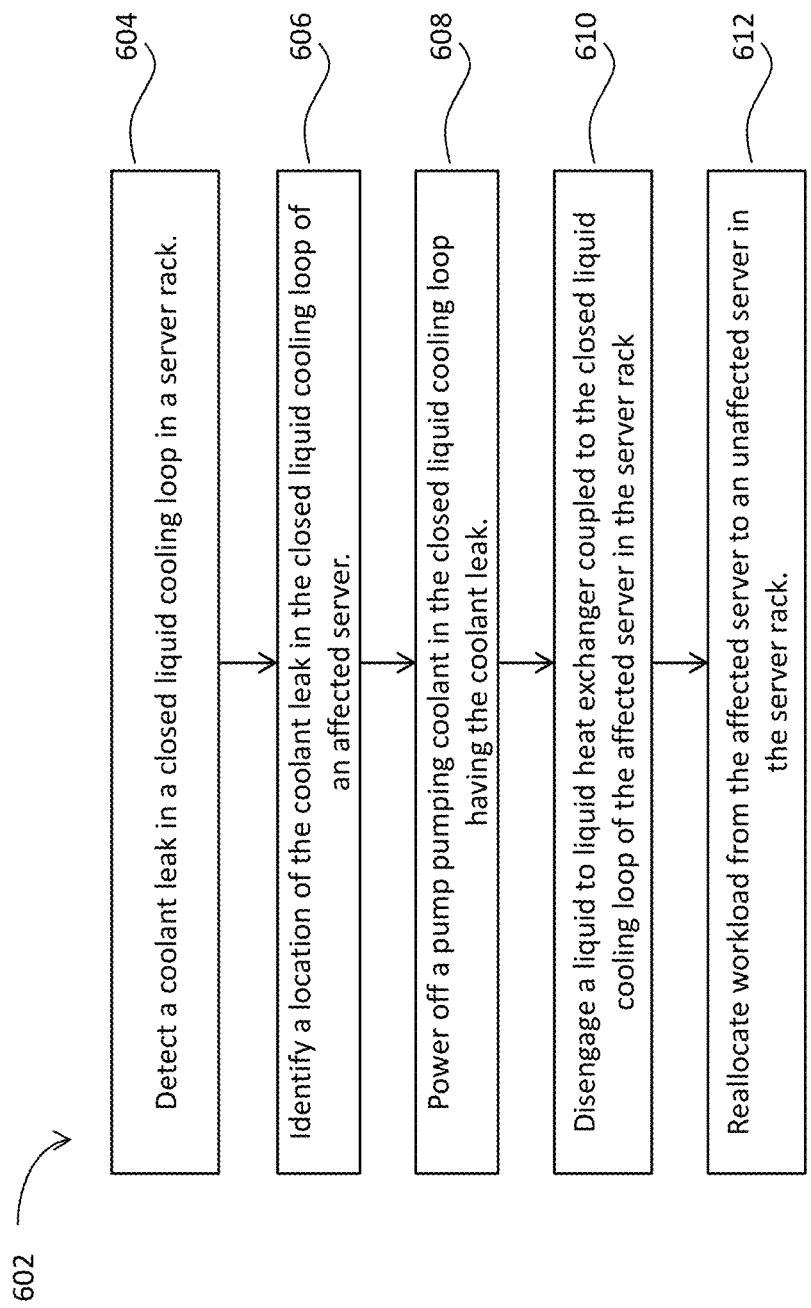
FIG. 6 shows a method of minimizing coolant leaks in liquid cooled electronic equipment in accordance with an embodiment of the invention.

FIG. 6 shows a method for minimizing coolant leaks in liquid cooled electronic equipment according to one embodiment of the present invention. According to an embodiment of the invention, the method 602 may be used to minimize the volume of liquid coolant leaked in a server rack.

The method 602 begins with a detection step 604. The detection step 604 involves detecting a coolant leak in a closed liquid cooling loop in the server rack. The closed liquid cooling loop may contain the entire volume of coolant provided to its respective server or servers in the server rack. As discussed above, the server rack includes several closed liquid cooling loops in a server rack, with each closed liquid cooling loop coupled to at least one server in the server rack.

After the detection step 604, the method 602 proceeds to identifying step 606. The identifying step 606 involves identifying a location of the coolant leak in the closed liquid cooling loop of an affected server in the server rack. Leak detection sensors can be used to identify a location of the coolant leak at the server rack.

After the identifying step 606, the method 602 proceeds to powering off step 608. The powering off step 608 involves powering off a pump corresponding to the closed liquid cooling loop of the affected server in the server rack.

According to an example embodiment of the present invention, after powering off step 608, the method 602 continues to disengaging step 610. At disengaging step 610, a liquid to liquid heat exchanger coupled to the closed liquid cooling loop of the affected server is disengaged. When the closed cooling loop is disengaged the liquid to liquid heat exchanger does not receive a facility side coolant.

According to another example embodiment of the present invention, after disengaging step 610, the method continues to reallocating step 612. At reallocating step 612, workload from the affected server is reallocated to an unaffected server in the server rack.

In yet another example embodiment, the method 602 may include a containing step. At the containing step, the leaked coolant is contained in one of a plurality of catch basins. Each of the catch basins may be positioned below at least one of the servers in the server rack. Each of the catch basins may collect the leaked coolant from at least one of the closed liquid cooling loops.

Figure 7:
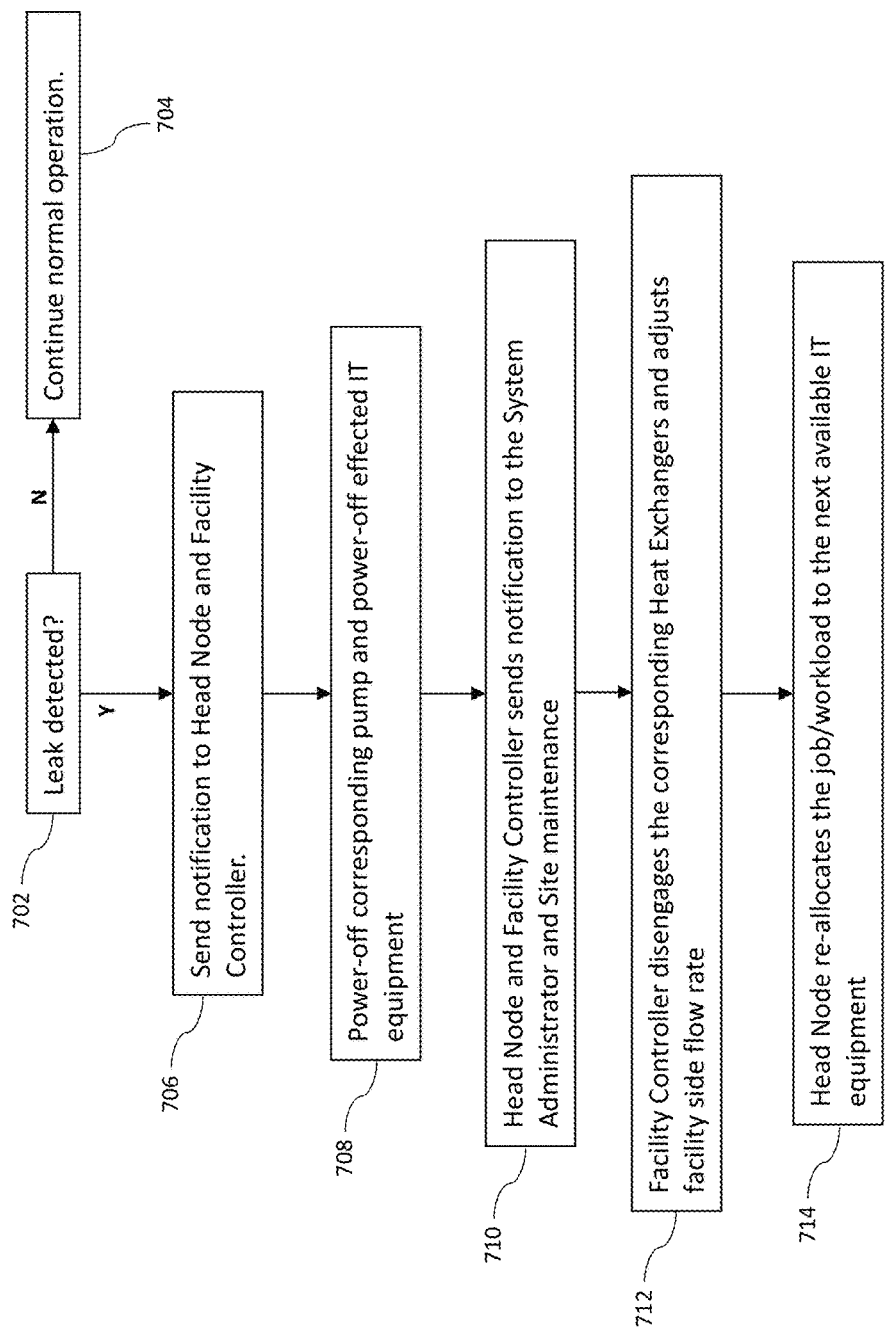
FIG. 7 shows a flowchart of a server level control method for coolant leak volume minimization in accordance with one embodiment of the invention.

FIG. 7 shows a flowchart of a server level control method for leak volume minimization in accordance with one embodiment of the invention. At the leak detected block 702, the system checks whether there is any leak at the server level. Leak detection may be determined, for example, by polling leak sensors. If not, the system continues to operate normally at block 704. If there is leak detected in the server, a notification is immediately sent to the head node as well as to the facility controller identifying the location and specifications of the corresponding equipment at block 706. A head node or a Hardware Management Console (HMC) node is a management server(s) that manages allocation and/or utilization of computational resources in a data center. The power to the corresponding pump and the power to the affected IT equipment are then turned off at block 708.

The head node and facility controller, subsequently, notifies the system administrator and site maintenance about the detected leak so that any additional actions can be immediately taken at block 710. Next, the facility controller disengages the corresponding heat exchangers and adjusts the facility side coolant flow rate as per the need of currently operational IT equipment at block 712. The job or workload that was assigned to the failed system is then re-allocated by the head node to the next available IT equipment at block 714.

Figure 8:
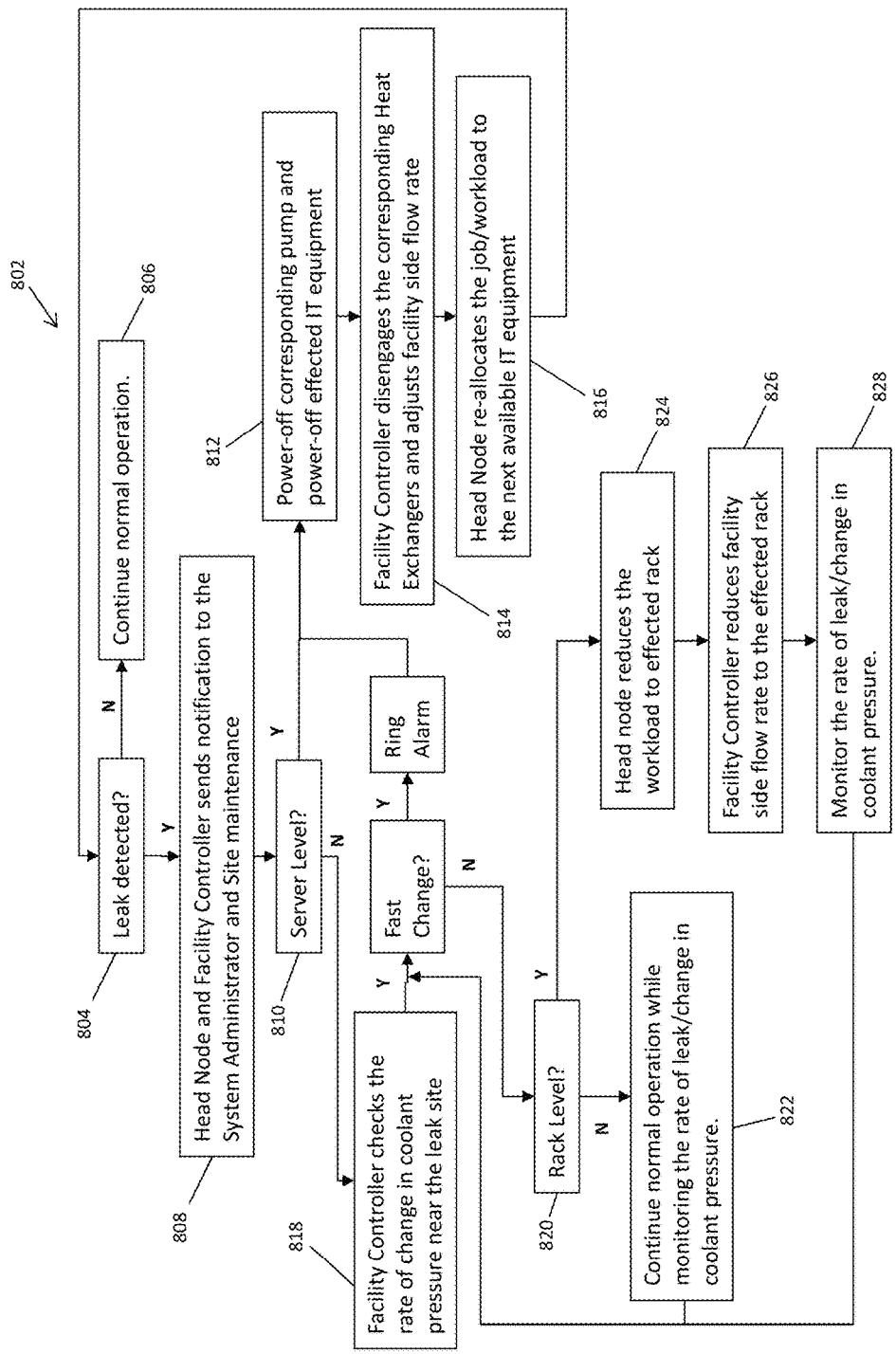
FIG. 8 shows a flowchart of a datacenter or facility level control method for coolant leak volume minimization in accordance with an embodiment of the invention.

FIG. 8 shows a flowchart 802 for a datacenter or facility level control method for leak volume minimization, as contemplated by one embodiment of the present invention. At the leak detected block 804, the system checks whether there is any leak at the server level. If not, the system continues to operate normally at block 806. If there is a leak detected, a notification is immediately sent to the head node as well as to the facility controller identifying the location and specifications of the affected or possibly-affected equipment at block 808. Block 810 checks if the leak was at the server level. If yes, the power to the corresponding pump and the power to the affected IT equipment are then turned off at block 812. The head node and facility controller, subsequently, notifies the system administrator and site maintenance about the detected leak so that any necessary additional action can immediately be taken.

Next, the facility controller disengages the corresponding heat exchangers and adjusts the facility side coolant flow rate as per the need of currently operational IT equipment at block 814. The job or workload that was assigned to the failed system is then re-allocated by the head node to the next available IT equipment at block 816. If the leak is not at the server level, the facility controller checks the rate of change of coolant pressure near the leak site at block 818. If the rate of change is fast enough (for example, 0.5 psi/min or so), an alarm is raised and the power to the corresponding pump and the power to the affected IT equipment are then turned off at block 812. The head node and facility controller, subsequently, notifies the system administrator and site maintenance about the detected leak so that any necessary additional action can be immediately taken.

Next, the facility controller disengages the corresponding heat exchangers and adjusts the facility side coolant flow rate as per the need of currently operational IT equipment at block 814. The job or workload that was assigned to the failed system is then re-allocated by the head node to the next available IT equipment at block 814. If the rate of change is slow, it is checked whether the leak is at the rack level at block 820. If not, normal operation is continued while monitoring the rate of leak or change of coolant pressure near the leak site at block 822. If the rate of change is slow and the leak is at the rack level, the head node reduces the workload to the affected rack at block 824.

Subsequently, the facility controller reduces the facility side coolant flow rate to the affected rack at block 826 and continues to monitor the rate of leak or change in coolant pressure at block 828.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As will be appreciated by one skilled in the art, aspects of the present invention may be embodied as a system, method or computer program product. Accordingly, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An apparatus for minimizing a volume of coolant leaked in liquid cooled electronic equipment, comprising:
   a server rack housing a plurality of servers configured to receive facility side coolant;
   a plurality of closed liquid cooling loops in the server rack, each of the closed liquid cooling loops coupled to at least one of the servers in the server rack, each of the closed liquid cooling loops restricting coolant flow entirely within the server rack;
   a plurality of catch basins in the server rack, each of the catch basins being positioned between the servers in the server rack, each of the catch basins configured to collect leaked coolant from a respective one of the plurality of closed liquid cooling loops;
   a plurality of basin leak detectors, each basin leak detector from the plurality of basin leak detectors positioned at a respective one of the plurality of catch basins and configured to detect the leaked coolant from the respective one of the plurality of closed liquid cooling loops;
   a plurality of liquid to liquid heat exchangers in the server rack, each of the liquid to liquid heat exchangers coupled to one of the closed liquid cooling loops in the server rack and configured to transfer heat from the closed liquid cooling loops to the facility side coolant;
   a plurality of pumps, each of the pumps positioned above the respective one of the plurality of catch basins and circulating a coolant inside the respective one of the plurality of closed liquid cooling loops, each of the pumps configured to power off in response to a respective one of the basin leak detectors positioned at a respective one of the plurality of catch basins detecting the leaked coolant from the respective one of the plurality of closed liquid cooling loops;
   a controller to power off a respective pump connected to the respective one of the plurality of closed liquid cooling loops with the leaked coolant from the respective one of the plurality of closed liquid cooling loops in response to detecting the leaked coolant by the respective one of the basin leak detectors; and
   a plurality of bypass valves configured to disengage a respective one of the plurality of liquid to liquid heat exchangers from the facility side coolant in response to detecting the leaked coolant from one of the plurality of closed liquid cooling loops.

2. The apparatus of claim 1, wherein each of the closed liquid cooling loops contains an entire volume of coolant provided to the respective at least one server in the server rack.

3. The apparatus of claim 1, further comprising a plurality of server leak detectors in the server rack, each of the server leak detectors configured to detect a condition indicative of the leaked coolant from at least one of the closed liquid cooling loops.

4. The apparatus of claim 3, further comprising wherein the controller is configured to power off a respective server when a respective server leak detectors detects the leaked coolant.

5. The apparatus of claim 1, wherein each of the closed liquid cooling loops isolates the coolant provided to each of the servers in the server rack such that a volume of the coolant provided to each of the servers is volume of the coolant contained in each of the closed liquid cooling loops coupled to the servers.

6. The apparatus of claim 1, further comprising a disengaged liquid to liquid heat exchanger from the plurality of liquid to liquid heat exchangers coupled to one of the plurality of closed liquid cooling loops having the leaked coolant in the server rack such that the disengaged liquid to liquid heat exchanger does not receive the facility side coolant.

7. An apparatus for minimizing a volume of coolant leaked in liquid cooled electronic equipment, comprising:
   a server rack housing a plurality of servers configured to receive facility side coolant;
   at least one closed liquid cooling loop coupled to the servers in the server rack, each of the closed liquid cooling loops restricting coolant flow entirely within the server rack;
   at least one catch basin in the server rack being positioned between the servers in the server rack, the catch basin configured to collect leaked coolant from the closed liquid cooling loop;
   at least one basin leak detector positioned at the catch basin and configured to detect the leaked coolant from the closed liquid cooling loop;
   a liquid to liquid heat exchanger coupled to each of the closed liquid cooling loops in the server rack and configured to transfer heat from the closed liquid cooling loops to the facility side coolant;
   a pump coupled to each of the closed liquid cooling loops, each of the pumps circulating a coolant inside the closed liquid cooling loop and configured to power off in response to the basin leak detector detecting the leaked coolant at the catch basin;
   a controller to power off a respective pump connected to the respective one of the plurality of closed liquid cooling loops with the leaked coolant from the respective one of the plurality of closed liquid cooling loops in response to detecting the leaked coolant by the respective one of the basin leak detector; and
   at least one bypass valve configured to disengage the liquid to liquid heat exchanger from the facility side coolant in response to the basin leak detector detecting the leaked coolant at the catch basin.

8. The apparatus of claim 7, wherein the closed liquid cooling loop contains an entire volume of the coolant provided to at least one of the servers in the server rack.

9. The apparatus of claim 7, further comprising wherein the controller is configured to power off the server when the basin leak detector detects the leaked coolant.

10. The apparatus of claim 7, wherein the closed liquid cooling loops isolates the coolant provided to each of the servers in the server rack such that volume of the coolant provided to each of the servers is volume of the coolant contained in each of the closed liquid cooling loops coupled to the servers.

* * * * *